US012677581B2

(12) United States Patent
Huang et al.

(10) Patent No.: US 12,677,581 B2
(45) Date of Patent: Jul. 7, 2026

(54) WRAPPING PEROVSKITE GRAINS WITH SILICA SHELLS FOR IMPROVED STABILITY AND EFFICIENCY OF PEROVSKITE ELECTRONIC DEVICES

(71) Applicant: NUtech Ventures, Lincoln, NE (US)

(72) Inventors: Jinsong Huang, Lincoln, NE (US); Yang Bai, Westlake (AU)

(73) Assignee: NUTECH VENTURES, Lincoln, NE (US)

( * ) Notice: Subject to any disclaimer, the term of this patent is extended or adjusted under 35 U.S.C. 154(b) by 0 days.

(21) Appl. No.: 16/709,339

(22) Filed: Dec. 10, 2019

(65) Prior Publication Data

US 2021/0171557 A1     Jun. 10, 2021

(51) Int. Cl.
*H10K 71/12* (2023.01)
*H10K 30/10* (2023.01)
(Continued)

(52) U.S. Cl.
CPC .......... *H10K 71/12* (2023.02); *H10K 30/352* (2023.02); *H10K 30/82* (2023.02); *H10K 30/88* (2023.02);
(Continued)

(58) Field of Classification Search
CPC ............. H01L 51/4206; H01L 51/4216; H01L 51/4266; H01L 51/442; H01L 51/448;
(Continued)

(56) References Cited

U.S. PATENT DOCUMENTS 9,391,287 B1 *  7/2016  Huang ............... H01L 51/4213
2015/0144196 A1  5/2015  Irwin et al.
(Continued)

FOREIGN PATENT DOCUMENTS

CN          106634133 A     5/2017
WO     WO-2017160955 A1 *  9/2017  ......... H01L 51/0034

OTHER PUBLICATIONS

Huang et al., "Enhancing the Stability of CH3NH3PbBr3 Quantum Dots by Embedding in Silica Spheres Derived from Tetramethyl Orthosilicate in "Waterless" Toluene", J. Am. Chem. Soc. 2016, 138, 18, 5749-5752.*
(Continued)

*Primary Examiner* — Golam Mowla
(74) *Attorney, Agent, or Firm* — Gerald T. Gray; Leydig, Voit & Mayer, LTD.

(57) ABSTRACT
Systems and methods for enhancing the stability and efficiency of perovskite materials, and devices incorporating such perovskite materials. A method of making a perovskite layer includes mixing a perovskite solution with a silica shell precursor solution to produce a perovskite-silica precursor solution, and spin casting or drop casting the perovskite-silica precursor solution on a substrate to form a perovskite material or material layer, wherein the perovskite material or material layer includes a plurality of groups of one or more perovskite grains, each of said plurality of groups wrapped in a silica shell. The silica shell precursor solution may have a chemical structure of $R_n$—Si—$(OR)_{4-n}$, where "R" is an alkyl, aryl, or organofunctional group, and "OR" is a methoxy, ethoxy, or acetoxy group.

11 Claims, 6 Drawing Sheets

(51) Int. Cl.

| | |
|---|---|
| *H10K 30/35* | (2023.01) |
| *H10K 30/50* | (2023.01) |
| *H10K 30/82* | (2023.01) |
| *H10K 30/88* | (2023.01) |
| *H10K 85/50* | (2023.01) |

(52) U.S. Cl.
CPC ............. *H10K 85/50* (2023.02); *H10K 30/10* (2023.02); *H10K 30/50* (2023.02)

(58) Field of Classification Search
CPC .... H10K 30/10; H10K 30/352; H10K 30/451; H10K 30/82; H10K 30/88
See application file for complete search history.

(56) References Cited

U.S. PATENT DOCUMENTS

| | | | |
|---|---|---|---|
| 2016/0380125 A1 | 12/2016 | Snaith et al. | |
| 2019/0002759 A1* | 1/2019 | D'Amico | .............. H01L 33/502 |
| 2019/0348575 A1* | 11/2019 | Lai | ........................ H01L 33/505 |

OTHER PUBLICATIONS

Yang et al., "High-performance photovoltaic perovskite layers fabricated through intramolecular exchange", Science, May 21, 2015, vol. 348, Issue 6240, pp. 1234-1237.*

Definition of "Several" as provided by Merriam-Webster web dictionary, accessed from https://www.merriam-webster.com/dictionary/several?utm_campaign=sd&utm_medium=serp&utm_source=jsonId, accessed on Jan. 13, 2023.*

Huang, S. et al., "Enhancing the Stability of CH3NH3PbBr3 Quantum Dots by Embedding in Silica Spheres Derived from Tetramethyl Orthosilicate in Waterless Toluene." Journal of the American Chemical Society, Apr. 21, 2016, vol. 138, pp. 5749-5752.

International Search Report in International Patent Application No. PCT/US2018/037619 dated Jun. 26, 2019.

Gao, Y. et al., "Preparation of SiO2-Encapsulated BaTiO3 Nanoparticles with Tunable Shell Thickness by Reverse Microemulsion", Particle & Particle Systems Characterization, 2013, vol. 30, No. 10, pp. 832-836.

* cited by examiner

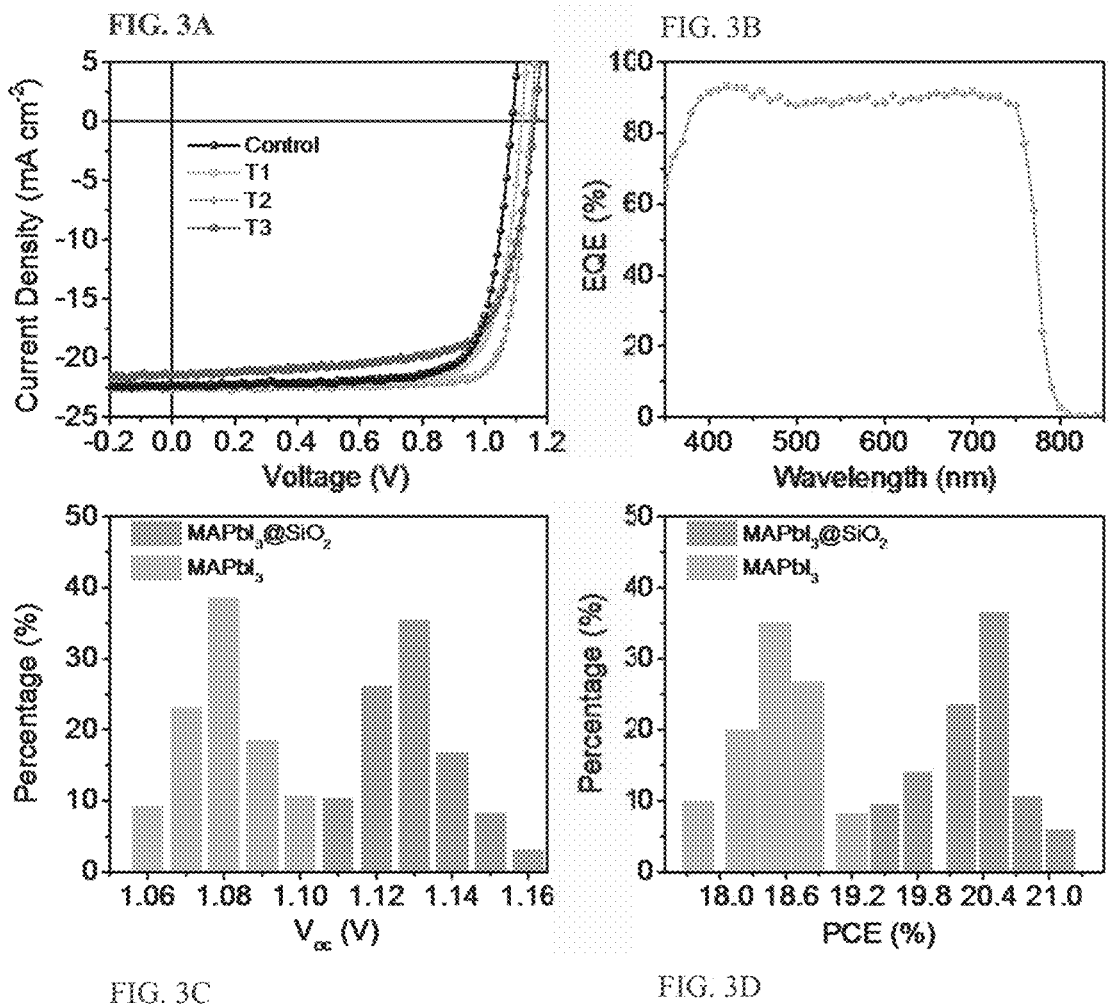
FIG. 3A
FIG. 3B
FIG. 3C
FIG. 3D
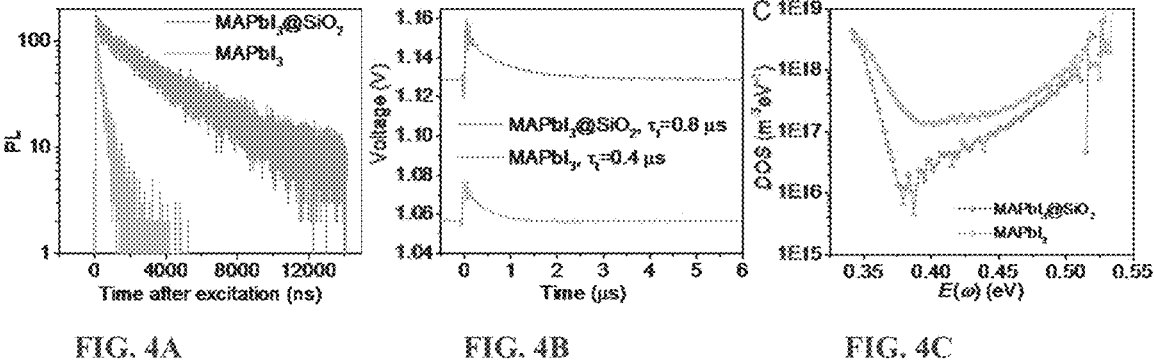
FIG. 4A
FIG. 4B
FIG. 4C

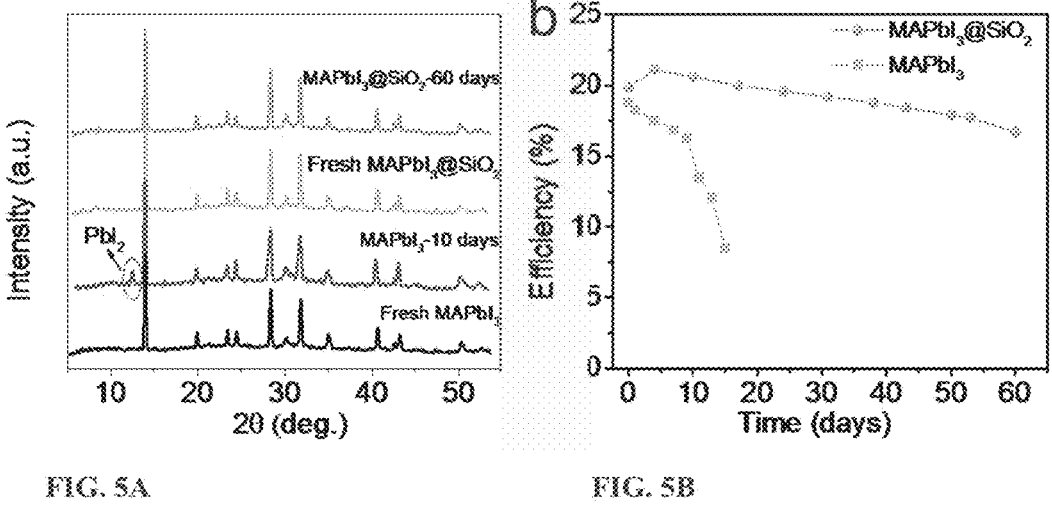
FIG. 5A
FIG. 5B
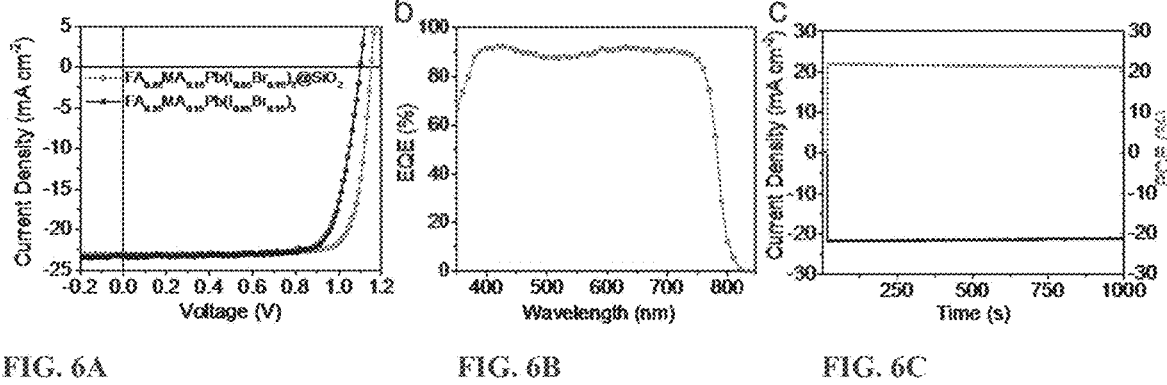
FIG. 6A
FIG. 6B
FIG. 6C

WRAPPING PEROVSKITE GRAINS WITH SILICA SHELLS FOR IMPROVED STABILITY AND EFFICIENCY OF PEROVSKITE ELECTRONIC DEVICES

STATEMENT REGARDING FEDERALLY SPONSORED RESEARCH OR DEVELOPMENT

This invention is made with government support under N00014-17-1-2163 awarded by the Office of Naval Research and under DE-EE0006709 awarded by the Department of Energy. The government has certain rights in the invention.

CROSS-REFERENCES TO RELATED APPLICATIONS

This application is a continuation of PCT Application US2018/037619, filed Jun. 14, 2018, which claims the benefit of U.S. Provisional Patent Application Ser. No. 62/519,325, filed Jun. 14, 2017, the disclosures of which are incorporated herein by reference in their entireties.

BACKGROUND

Inorganic-organic halide perovskites represent a major break-through in the development of highly efficient photovoltaic materials. For example, within only several years, polycrystalline thin-film perovskite photovoltaic ("PV") devices have achieved power conversion efficiency ("PCE") of 22.1%. The rapid rise in PCE, coupled with the prospect of low-cost precursors and facile synthesis, render perovskite photovoltaic devices highly competitive for commercial applications.

There is still a need for improved perovskite materials and perovskite-based devices, particularly for photovoltaic applications.

BRIEF SUMMARY

The present disclosure provides systems and methods for enhancing the stability and efficiency of perovskite materials, and devices incorporating such perovskite materials. Enhancing the stability of perovskite materials advantageously increases the lifetime of any electronic devices, such as solar cells, incorporating perovskite materials as an active layer.

Certain embodiments provide methods for in-situ coating or wrapping perovskite grains with a thin layer silica ($SiO_2$) shell to stabilize the perovskite. Most inorganic matrix materials are mechanically robust and airtight. Among them, silica is an attractive coating material due to its stability against environmental and chemical factors and excellent optical properties. A method to wrap the perovskite grains (e.g., one or more grains per wrapping) with silica shells to protect the perovskite grains includes mixing silica precursors in perovskite precursor solution. During the formation of perovskite grains, the silica precursor is converted to silica by hydrolysis or other type of reaction. This results in wrapping the perovskite grains with a waterproof silica shell without sacrificing the electronic transport properties with a well-controlled shell thickness and wrapping chemistry. The silica shell layer protects perovskite grain surfaces from defect-generation and provides a passivation function, as evidenced by the dramatically elongated charge recombination lifetime, and thus increases the efficiency of electronic devices incorporating perovskite materials. Preliminary studies indicate the perovskite materials showed much better resistance to moisture-induced degradation of perovskite films after wrapping with a silicon-based coating layer. This method is useful for all perovskite\-related electronic devices, including photovoltaic devices such as solar cells.

According to an embodiment, a device including a perovskite layer is provided wherein the perovskite layer includes a plurality of perovskite grains, each grain wrapped in a silica shell.

According to another embodiment, a device including a perovskite layer is provided, wherein the perovskite layer includes a plurality of groups of one or more perovskite grains, each of said plurality of groups wrapped in a silica shell.

According to yet another embodiment, a method of forming a perovskite layer is provided wherein the perovskite layer includes a plurality of groups of one or more perovskite grains, each of said plurality of groups wrapped in a silica shell.

According to yet a further embodiment, a method of making or forming a perovskite layer is provided, which includes mixing a perovskite solution with a silica shell precursor solution to produce a perovskite-silica precursor solution, and spin casting or drop casting the perovskite-silica precursor solution on a substrate to form a perovskite material or material layer, wherein the perovskite material or material layer includes a plurality of groups of one or more perovskite grains, each of said plurality of groups wrapped in a silica shell. In certain aspects, the silica shell precursor solution has a chemical structure of $R_n$—Si—$(OR)_{4-n}$, where "R" is an alkyl, aryl, or organofunctional group, and "OR" is a methoxy, ethoxy, or acetoxy group.

According to a further embodiment, a semiconductor device is provided that includes a cathode layer, an anode layer, and an active layer disposed between the cathode layer and the anode layer, where the active layer includes a perovskite layer, wherein the perovskite layer includes a plurality of groups of one or more perovskite grains, each of said plurality of groups wrapped in a silica shell.

According to the various embodiments, in certain aspects, the perovskite material or layer includes organometal trihalide perovskite (grains) having the formula $ABX_3$, or $A_{2B}X_4$, wherein A is methylammonium ($CH_3NH_3^+$), formamidinium ($H_2NCHNH_2^+$), or an alkali-metal ion, B is a metal cation, and X is a halide anion, thiocyanate ($SCN^-$) or a mixture thereof. In certain aspects, the perovskite layer includes perovskite (grains) having the formula $MAPbI_3$, $FA_{1-x}MA_xPb(I_{1-x}Br_x)_3$, $CsPb(I_{1-x}Br_x)_3$, $Cs_yFA_{1-x-y}MA_xPb(I_{1-x}Br_x)_3$, $Rb_zCs_yFA_{1-x-y-z}MA_xPb(I_{1-x}Br_x)_3$, or $Rb_zCs_yFA_{1-x-y-z}MA_xPb_nSn_{1-n}(I_{1-x}Br_x)_3$ where x, y, z, and n may be between 0 and 1.

According to the various embodiments, in certain aspects, the silica shell precursor solution has a chemical structure of $R_n$—Si—$(OR)_{4-n}$, where "R" is an alkyl, aryl, or organofunctional group, and "OR" is a methoxy, ethoxy, or acetoxy group.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

FIG. 3A shows the photocurrent density-voltage (J-V) characteristics of a perovskite devices (e.g., solar cells) based on conventional perovskite films and different silica-wrapped perovskite films.

FIG. 3B shows EQE of an optimized silica-wrapped perovskite device.

FIG. 3C shows Statistics of the $V_{OC}$ for devices with conventional and silica-wrapped perovskite films.

FIG. 3D shows the PCE distribution for devices with conventional and silica-wrapped perovskite films.

FIG. 4A shows normalized time resolved PL decay curves of the MAPbI₃ and MAPbI₃@SiO₂ films on glass substrates.

FIG. 4B shows transient photovoltage decay curves of perovskite devices based on MAPbI₃ and MAPbI₃@SiO₂ films under one sun illumination.

FIG. 4C shows total density of states (DOS) of perovskite devices fabricated with MAPbI₃ and MAPbI₃@SiO₂ films.

FIG. 5A shows XRD of MAPbI₃ and MAPbI₃@SiO₂ films after storage in air.

FIG. 5B shows photovoltaic performance of the typical perovskite solar cells based on conventional perovskite film and silica-wrapped perovskite film exposed to an ambient environment without encapsulation as a function of storage time; air humidity varies from 20 RH % to 70 RH %.

FIG. 6A shows photocurrent-voltage (J-V) characteristics of solar cells based on conventional and silica-wrapped FA/MA hybrid perovskite films.

FIG. 6B shows EQE of an optimized device with silica-wrapped perovskite.

FIG. 6C shows steady-state photocurrent and efficiency at the maximum power point (1.00 V) of an optimized device with silica-wrapped perovskite.

DETAILED DESCRIPTION

Figure 1:
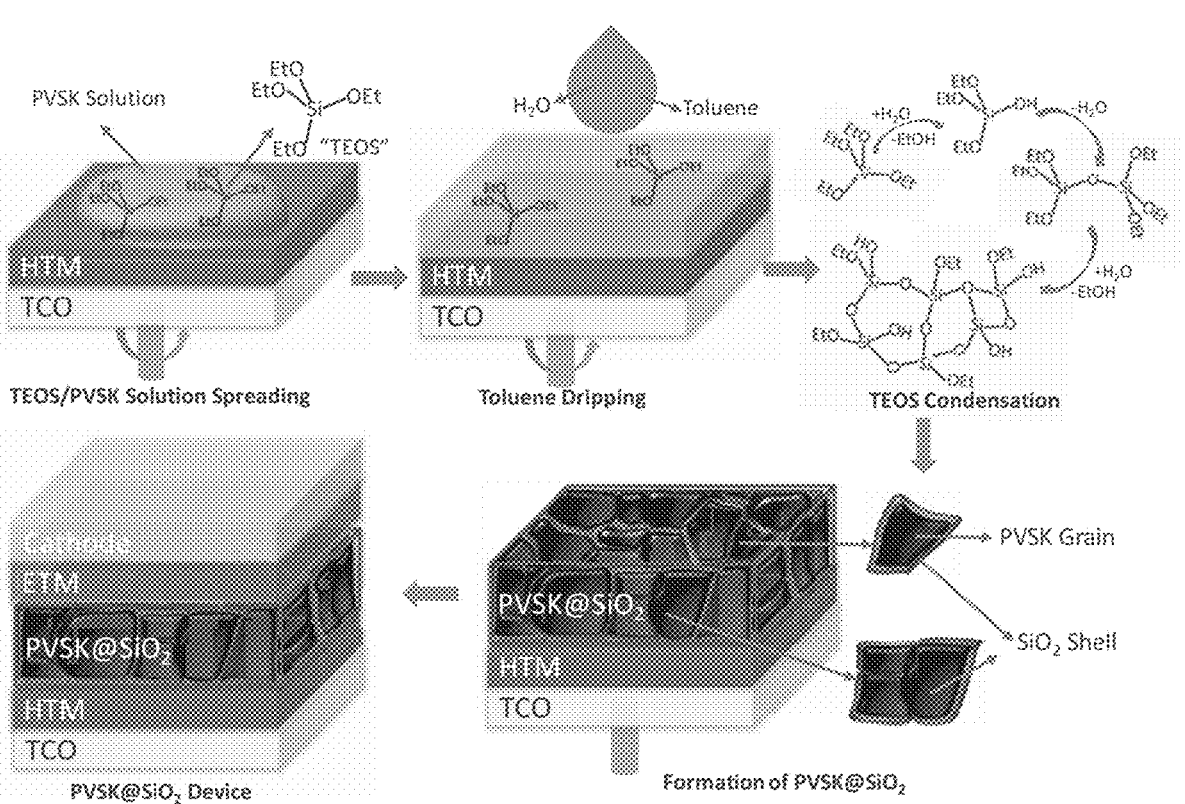
FIG. 1 shows a method of coating perovskite grains with silica shells according to an embodiment.

FIG. 1 illustrates a method of coating perovskite grains with silica shells according to an embodiment. FIG. 1 illustrates schematically a process of in-situ coating perovskite grains with silica shells and device structure of the silica-coated perovskite planar heterojunction solar cells. In certain embodiments, tetraethyl orthosilicate (TEOS) is used as a silica precursor as TEOS can be readily hydrolyzed to form SiO₂ over perovskite grains when contacting with the low-content water in toluene. The silica-coated perovskite films may be used for fabrication of p-i-n solar cells, which have a general structure of transparent conductive oxide (TCO) electrodes/hole transport material (HTM)/perovskite/electron transport materials (ETM)/cathode. For in-situ coating perovskite grains with silica shells, TEOS is used as a silica precursor included into the perovskite precursor solution according to an embodiment. The low content moisture or OH— group containing organic molecules in the film environment drives the hydrolysis of TEOS, which builds silica shells around perovskite grains. The typical reaction and coating process is illustrated in FIG. 1. The description below is based on the perovskite material of CH₃NH₃PbI₃ (MAPbI₃) and TEOS, but the methodology is applicable to other perovskite materials and silica precursors with a general material selection rule described herein. A p-i-n structure perovskite solar cell is used merely as an example to demonstrate the various concepts, but an n-i-p device structure, or other device structures incorporating the various perovskite materials, can also apply the same or similar concepts.

In an embodiment, a perovskite layer is formed on a substrate. In a first step, a perovskite solution with a silica shell precursor solution to produce a perovskite-silica precursor solution, and in a second step, the perovskite-silica precursor solution is formed, e.g., via spin casting or drop casting or other deposition method, on the substrate to form a perovskite layer, wherein the perovskite layer includes a plurality of groups of one or more perovskite grains, each of said plurality of groups wrapped in a silica shell. The substrate may include, for example, glass or ITO/glass or other rigid or semi rigid material. The substrate may also include other intermediary layers as desired, for example a hole transport material, electrode materials, etc.

In the specific example shown in FIG. 1, a hole transport material (HTM) layer, e.g., a layer of poly(bis(4-phenyl)(2, 4,6-trimethylphenyl)amine) (PTAA) film, is deposited onto a substrate, e.g., ITO/glass substrate or TCO. For example, the HTM may be deposited by spin-coating 0.2 wt % PTAA in toluene at 4000 r.p.m for 35 s. The as-prepared film may then be thermally annealed, e.g., at 100° C. for 10 min. MAPbI₃ films may be fabricated by one-step spin coating with an anti-solvent extraction approach, for example as described in Chen, B., et al., Efficient Semitransparent Perovskite Solar Cells for 23.0%-Efficiency Perovskite/Silicon Four-Terminal Tandem Cells. Advanced Energy Materials, 2016. The perovskite precursor solution (PVSK solution) may be prepared by dissolving PbI₂ and MAI in DMF and DMSO (e.g., 461 mg PbI₂ and 159 mg MAI in 700 µL DMF and 78 µL DMSO). For silica-coated perovskite film deposition, a silica shell precursor is blended into or mixed with the perovskite precursor. In this particular example, TEOS was used as the silica shell precursor and was blended into the perovskite precursor solution. To determine optimized device performance, different ratios of TEOS were introduced into the perovskite precursor solutions. T1, T2, and T3 represent the devices fabricated using 3 vol %, 5 vol %, and 10 vol % TEOS modified perovskite precursor solution, respectively. The MAPbI₃ precursor solution (mixed with silica shell precursor) was deposited onto a substrate (e.g., spun onto PTAA at 2000 r.p.m for 2 s and 4000 r.p.m for 20 s). The sample was drop-casted with toluene (e.g., 120 toluene at 8 s of the second-step spin-coating). Subsequently, the sample was annealed (e.g., at 65° C. for 10 min and 100° C. for 10 min). The electron-transporter layer (e.g., PCBM) is deposited on or coated (e.g., by spinning 2 wt % PCBM in dichlorobenzene at 6000 r.p.m for 35 s) on the perovskite layer and then annealed (e.g., at 100° C. for 30 min). Thereafter, the electrode layers are formed. For example, 20 nm $C_{60}$ and 8 nm bathocuproine (BCP) were sequentially deposited by thermal evaporation, and 80 nm Cu was deposited by thermal evaporation as the device cathode.

Figures 2A, 2B, 2C:
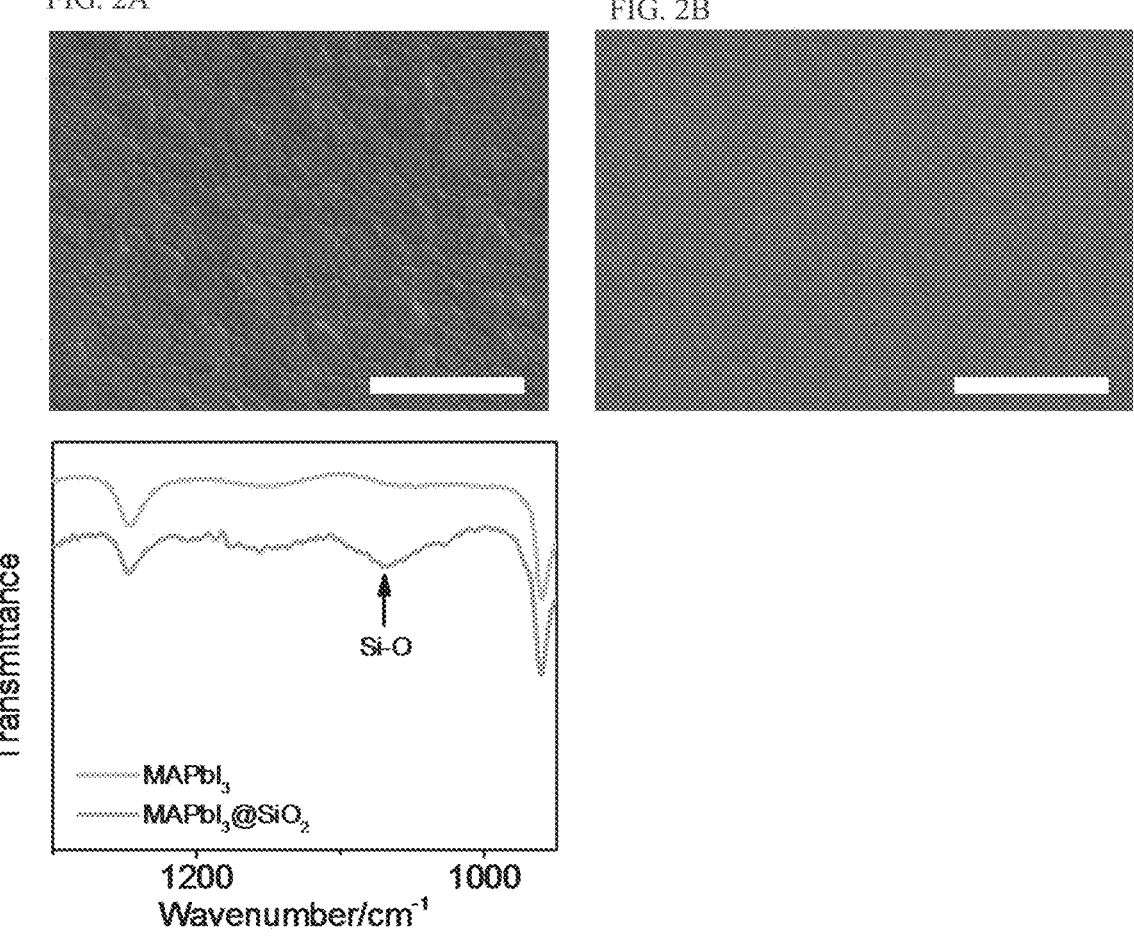
FIG. 2A shows an SEM image of a MAPbI₃ film.
FIG. 2B shows an SEM image of a MAPbI₃@SiO₂ film according to an embodiment.
FIG. 2C shows FTIR spectra of MAPbI₃ film and MAPbI₃@SiO₂ films according to an embodiment.
Figure 2D:
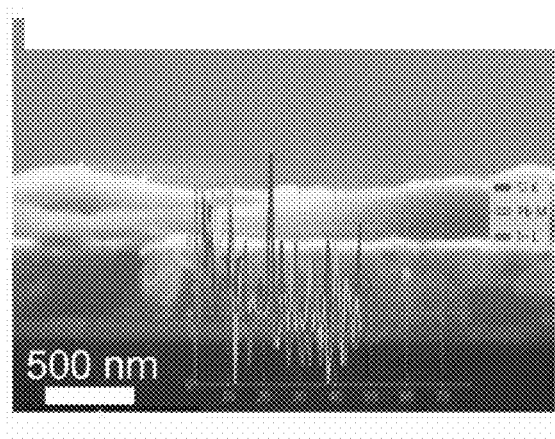
FIG. 2D shows an EDX element line scan profile acquired across the cross-section of a MAPbI₃@SiO₂ film according to an embodiment.

Top-view scanning electron microscopy (SEM) was employed to characterize a $SiO_2$ wrapped perovskite film. Compared with the bare perovskite film shown in FIG. 2A, the grain boundaries (GBs) were obscure in $SiO_2$ wrapped perovskite film as shown in FIG. 2B, which indicates that the top surface and GBs of perovskite has been well coated with a layer of $SiO_2$. Fourier transform infrared spectroscopy (FTIR) transmission spectra of both $MAPbI_3$ and $MAPbI_3@SiO_2$ ($SiO_2$ wrapped $MAPbI_3$ perovskite) films were collected to verify the formation of the $SiO_2$ layer. Perovskite films on ITO substrates with and without $SiO_2$ wrapping layers were prepared by following the same procedure as that for device fabrication above and the collected powder was subjected to FTIR analysis. As shown in FIG. 2C, the appearance of a new and wide vibration peak between 1,101 and 1,035 $cm^{-1}$ confirms the formation of Si—O—Si bonds. To investigate and further confirm the formation of $SiO_2$ wrapping layer, bulk compositional analysis for the $SiO_2$ wrapped perovskite film was performed with energy-dispersive X-ray spectroscopy (EDX). FIG. 2D shows the EDX element line scan profile acquired across the cross-section of the film; the majority of $SiO_2$ was distributed at the GBs, indicating the formation of a $SiO_2$ wrapping layer.

FIG. 3A shows the photocurrent density-voltage (J-V) characteristics of perovskite devices (e.g., solar cells) based on conventional perovskite films and different silica-wrapped perovskite films. A typical perovskite device had a short-circuit current density ($J_{SC}$) of 22.3 mA $cm^{-2}$, an open-circuit voltage ($V_{OC}$) of 1.09 V, and a fill factor (FF) of 76.5% yielding a moderate PCE of 18.6%, which is consistent with previous reported work. When 3 vol % TEOS was blended into the precursor solution, the device $V_{OC}$ and FF increased to 1.12 V and 77.4%, respectively. The device employing silica-wrapped perovskite delivered an efficiency of 19.3%. By adding 5 vol % TEOS, the optimized performance was achieved exhibiting a $J_{SC}$ of 22.7 mA $cm^{-2}$, a $V_{OC}$ of 1.15 V, and a FF of 80.9%, yielding a PCE of 21.1%. The integrated $J_{SC}$ from external quantum efficiency (EQE) spectrum shown in FIG. 3B reached 22.3 mA $cm^{-2}$, which is in good agreement with that from J-V measurement. Further increasing the ratio of TEOS to 10 vol % deteriorated the device performance. The photovoltaic parameters of these perovskite devices are summarized in Table 1. The statistics of $V_{OC}$ and PCE distributions shown in FIG. 3C and FIG. 3D demonstrate the reliability and repeatability of the $V_{OC}$ and PCE enhancement obtained by employing $SiO_2$-wrapped perovskite.

ping, the charge carrier transfer and photo-generated charge recombination lifetime were characterized by time-resolved photoluminescence (TRPL) decay and transient photovoltage (TPV) decay. As shown in FIG. 4A, the TRPL decay of the $MAPbI_3@SiO_2$ film is much slower than that of bare $MAPbI_3$ film, indicating slower carrier recombination in the silica-wrapped perovskite films. A charge recombination lifetime of 0.8 μs was deduced from TPV decay curves measured under one sun illumination for the $MAPbI_3@SiO_2$ based device, which was substantially longer than that (0.4 μs) of the device with pristine, bare $MAPbI_3$, as illustrated in FIG. 4C. The longer charge recombination lifetime indicates the suppressed charge recombination at the film surface and/or grain boundaries, which was attributed to the well passivation of the $SiO_2$ layer. The passivation effect of $SiO_2$ was further verified by measuring the trap density of the devices with and without $SiO_2$ wrapping. The variation of charge trap density in the $MAPbI_3@SiO_2$-based device was analyzed using thermal admittance spectroscopy (TAS) measurements. As shown in FIG. 4C, there was a relatively large density of charge trap states, on the order of $10^{17}$ to $10^{18}$ $m^{-3}$ in the device with conventional perovskite layer. The tDOS of traps with an energy depth of 0.33-0.45 eV decreased by one to two orders of magnitude after wrapping perovskite grains with $SiO_2$ layers.

In order to study the stability of the silica-wrapped perovskite, all the films and devices were exposed to ambient environment without further encapsulation. After storing in air for 10 days, the impurity peak which is indexed to $PbI_2$ appeared in the XRD pattern of bare $MAPbI_3$ (see, FIG. 5A). In striking contrast, no impurity peak was identified in the XRD pattern of $MAPbI_3@SiO_2$ even after exposure to air for 60 days. The performance of the perovskite device employing conventional perovskite degraded rapidly as shown in FIG. 5B. In comparison, the efficiency of the device made of silica-coated perovskite (FIG. 5B) maintained nearly 90% of its original efficiency after 53 days.

In one particular embodiment, a perovskite material of the form $FA_{1-x}MA_xPb(I_{1-x}Br_x)_3$ may be used. To study the versatility of the silica wrapping methodology, devices were fabricated using $FA_{1-x}MA_xPb(I_{1-x}Br_x)_3$ with x=0.15: $FA_{0.85}MA_{0.15}Pb(I_{0.85}Br_{0.15})_3$. An optimized device with $FA_{0.85}MA_{0.15}Pb(I_{0.85}Br_{0.15})_3@SiO_2$ delivered an efficiency of 21.5% shown in FIG. 6A. The integrated $J_{SC}$ from external quantum efficiency (EQE) spectrum shown in FIC 6B reached 22.9 mA $cm^{-2}$, which is in good agreement with that from J-V measurement. The steady-state photocurrent and efficiency measured at the maximum power point (1.00 V) are presented in FIG. 6C, which confirms the device performance parameters (Table 2) extracted from the J-V curve and verifies the absence of photocurrent hysteresis in these devices.

TABLE 1

Photovoltaic performance of perovskite ($MAPbI_3$) solar cells employing bare and $SiO_2$ wrapped perovskite films.

| Sample | $J_{sc}$ (mA $cm^{-2}$) | $V_{oc}$ (V) | FF (%) | η (%) |
|---|---|---|---|---|
| Control | 22.3 | 1.09 | 76.5 | 18.6 |
| T1 | 22.3 | 1.12 | 77.4 | 19.3 |
| T2 | 22.7 | 1.15 | 80.9 | 21.1 |
| T3 | 21.5 | 1.16 | 71.7 | 17.9 |

In order to provide further insight into the mechanisms for the performance enhancement induced by the $SiO_2$ wrap-

TABLE 2

Photovoltaic performance of perovskite ($FA_{0.85}MA_{0.15}$ $Pb(I_{0.85}Br_{0.15})_3$) solar cells employing bare and $SiO_2$ wrapped perovskite films.

| Sample | $J_{sc}$ (mA $cm^{-2}$) | $V_{oc}$ (V) | FF (%) | η (%) |
|---|---|---|---|---|
| $FA_{0.85}MA_{0.15}Pb(I_{0.85}Br_{0.15})_3$ | 23.2 | 1.1 | 77.6 | 19.8 |
| $FA_{0.85}MA_{0.15}Pb(I_{0.85}Br_{0.15})_3@SiO_2$ | 23.1 | 1.15 | 81.1 | 21.5 |

To assess the long-term operational stability of $FA_{0.85}MA_{0.15}Pb(I_{0.85}Br_{0.15})_3@SiO_2$ solar cells, a device was placed under continuous one sun illumination with a

Figure 7:
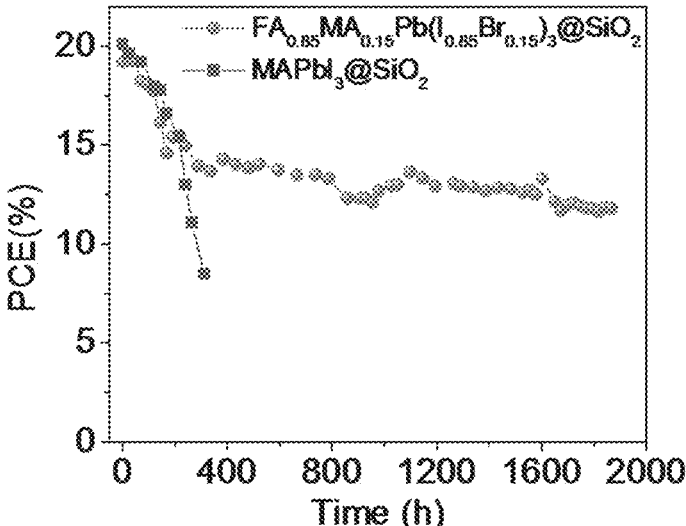
FIG. 7 shows photovoltaic performance of typical perovskite solar cells based on conventional and silica-wrapped FA/MA hybrid perovskite films under continuous AM 1.5 one sun illumination with encapsulation as a function of illumination time.

7 reference MAPbI$_3$@SiO$_2$ device. The devices were kept at a temperature of 80° C. for accelerated degradation study. As shown in the FIG. 7, all devices exhibited a fast degradation over the first 100 hours (h), with the MAPbI$_3$@SiO$_2$ cell degrading to below 7% within 400 h. In contrast, the FA$_{0.85}$MA$_{0.15}$Pb(I$_{0.85}$Br$_{0.15}$)$_3$@SiO$_2$ cell only degraded by a few percent absolute efficiency over the first 100 h and then proceed to degrade at a much slower linear rate.

In certain aspects, the silica shell coated on the perovskite grains should be within about 1-10 nm in thickness so as to not disadvantageously impact the charge transport property of the perovskite.

In certain embodiments, the general chemical structure of the silica precursors is Rn-Si—(OR)4-n, where "R" is an alkyl, aryl, or organofunctional group, and "OR" is a methoxy, ethoxy, or acetoxy group. Example silica shell precursors include tetraethoxysilane (TEOS), tetramethoxysilane (TMOS), Tetrapropyl orthosilicate, organoalkoxysilanes, 3-(trimethoxysilyl)propylmethacrylate (TMSPMA), 3-glycidoxypropyltrimethoxysilane (GLYMO), methyltrimethoxysilane (MTMOS), (3-Glycidyloxypropyl)trimethoxysilane, (3-Mercaptopropy)trimethoxysilane, (3-Glycidyloxypropyl)trimethoxysilane, N-[3-(Trimethoxysilyl)propyl]ethylenediamine, 3-Aminopropyl(diethoxy)methylsilane, [3-(2-Aminoethylamino)propyl]trimethoxysilane, 3-(Trimethoxysilyl)propyl methacrylate, Triacetoxy(methyl)silane, (3-Aminopropyl)tris(trimethylsiloxy)silane, Triacetoxy(vinyl)silane, Tris(2-methoxyethoxy)(vinyl)silane, Silicon tetraacetate, Mpeg5K-Silane, Triethoxy(4-methoxyphenyl)silane, Cyanomethyl [3-(trimethoxysilyl)propyl] trithiocarbonate, and Trimethoxy[2-(7-oxabicyclo[4.1.0]hept-3-yl)ethyl]silane.

In certain device embodiments, a first carrier transport layer (e.g., ETM layer) is disposed between the active layer (e.g., perovskite@silica layer) and the cathode, and a second carrier transport layer (e.g., HTM layer) is disposed between the active layer and the anode, the first carrier transport layer having a higher electron conductivity than the second carrier transport layer, the second carrier transport layer having a higher hole conductivity than the first carrier transport layer.

In certain embodiments, the first carrier transport layer comprises at least one of C$_{60}$, a fullerene, a fullerene-derivative, LiF, CsF, LiCoO$_2$, Cs$_2$CO$_3$, TiO$_x$, TiO$_2$ nanorods (NRs), ZnO, ZnO nanorods (NRs), ZnO nanoparticles (NPs), ZnO, Al$_2$O$_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), graphene, poly(ethylene glycol) (PEG), Polyethylenimine (PEI), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFPNBr), or poly(ethylene oxide) (PEO).

In certain embodiments, the second carrier transport layer comprises at least one poly(3,4-ethylenedioxithiophene) (PEDOT) doped with poly(styrene sulfonicacid) (PSS), 4,4'bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl) diphenylamine] (PFT), 4,4'bis[(p-trichlorosilylpropylphenyl)phenylamino] biphenyl (TSPP), 5,5'-bis[(p-trichlorosilylpropylphenyl)phenylamino]-2,20-bithiophene (TSPT), N-propyltriethoxysilane, 3,3,3-trifluoropropyltrichlorosilane or 3-aminopropyltriethoxysilanePoly[bis(4-phenyl)(2,4,6-trimethylphenyl)amine] (PTAA), V2O5, VOx, MoO3, WO3, ReO3, NiOx, ABO$_2$ (A and B are metal cations, e.g. CuAlO$_2$, CuGaO$_2$), AgOx/PEDOT:PSS, Cu2O, CuSCN/P3HT, or Au nanoparticles.

In certain embodiments, the anode layer includes at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

In certain embodiments, the cathode layer includes at least one of copper, aluminum, calcium, magnesium, lithium, sodium, potassium, strontium, cesium, barium, iron, cobalt, nickel, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description.

The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A semiconductor device, comprising:
a cathode layer;
an anode layer; and
an active layer disposed between the cathode layer and the anode layer, wherein the active layer includes a perovskite layer, wherein the perovskite layer includes a plurality of groups of one or more perovskite grains, each of said plurality of groups wrapped in an individual silica shell, wherein the silica shells reduce a density of charge trap states in the perovskite layer and increase a charge recombination lifetime of the perovskite layer;
wherein semiconductor device comprises electron transport through the perovskite layer between the cathode layer and the anode layer; and
wherein each silica shell has a thickness of between about 1 nm and about 10 nm.

2. The semiconductor device of claim 1, wherein the perovskite layer includes organometal trihalide perovskite having the formula $ABX_3$, or $A_{2B}X_4$, wherein A is methylammonium ($CH_3NH_3^+$), formamidinium ($H_2NCHNH_2^+$), or an alkali-metal ion, B is a metal cation, and X is a halide anion, thiocyanate ($SCN^-$) or a mixture thereof.

3. The semiconductor device of claim 1, further comprising:
a first carrier transport layer disposed between the active layer and the cathode; and
a second carrier transport layer disposed between the active layer and the anode, the first carrier transport layer having a higher electron conductivity than the second carrier transport layer, the second carrier transport layer having a higher hole conductivity than the first carrier transport layer.

4. The semiconductor device of claim 3, wherein:
the first carrier transport layer comprises at least one C60, a fullerene, a fullerene-derivative, LiF, CsF, $LiCoO_2$, $CS_{2C}O_3$, $TiO_x$, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), graphene, poly(ethylene glycol) (PEG), Polyethylenimine (PEI), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFPNBr), or poly(ethylene oxide) (PEO); and the second carrier transport layer comprises at least one poly(3,4-ethylenedioxithiophene) (PEDOT) doped with poly(styrene sulfonicacid) (PSS), 4,4'bis [(ptrichlorosilylpropylphenyl)phenylamino]biphenyl (TPD-Si2), poly(3-hexyl-2,5-thienylene vinylene) (P3HTV) and C60, copper phthalocyanine (CuPc), poly [3,4-(1hydroxymethyl)ethylenedioxythiophene] (PHEDOT), n-dodecylbenzenesulfonic acid/hydrochloric acid-doped poly(aniline) nanotubes (a-PANIN) s, poly(styrenesulfonic acid)-graft-poly(aniline) (PSSA-g-PANI), poly [(9,9-dioctylfluorene)-co-N-(4-(1-methylpropyl)phenyl)diphenylamine] (PFT), 4,4'bis [(p-trichlorosilylpropylphenyl)phenylamino]biphenyl (TSPP), 5,5'-bis [(p-trichlorosilylpropylphenyl)phenylamino]-2,20-bithiophene (TSPT), N-propyltriethoxysilane, 3,3,3-trifluoropropyltrichlorosilane or 3-aminopropyltriethoxysilanePoly[bis(4-phenyl) (2,4,6-trimethylphenyl)amine] (PTAA), $V_2O_5$, VOX, $MoO_3$, $WO_3$, $ReO_3$, $NiO_x$, $AgO_x$/PEDOT:PSS, $Cu_2O$, $ABO_2$, wherein A and B are metal cations, $CuAlO_2$, $CuGaO_2$, CuSCN/P3HT, or Au nanoparticles.

5. The semiconductor device of claim 1, wherein the anode layer includes at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

6. The semiconductor device of claim 1, wherein the cathode layer includes at least one of copper, aluminum, calcium, magnesium, lithium, sodium, potassium, strontium, cesium, barium, iron, cobalt, nickel, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

7. The semiconductor device of claim 1, wherein the perovskite grains comprise $MAPBI_3$.

8. The semiconductor device of claim 1, wherein the perovskite grains comprise $FA_{1-x}MA_xPb(I_{1-x}Br_x)_3$.

9. The semiconductor device of claim 1, wherein the perovskite layer is formed by:
mixing a perovskite solution with a silica shell precursor solution to produce a perovskite-silica precursor solution; and
spin casting or drop casting the perovskite-silica precursor solution on a substrate.

10. The semiconductor device of claim 9, wherein the silica shell precursor solution has a chemical structure of Rn-Si—(OR)4-n, where "R" is an alkyl, aryl, or organo-functional group, and "OR" is a methoxy, ethoxy, or acetoxy group.

11. The semiconductor device of claim 9, wherein the perovskite precursor solution comprises MAI and $PbI_2$.

* * * * *